United States Patent [19]
Bianca et al.

[11] Patent Number: 5,620,086
[45] Date of Patent: Apr. 15, 1997

[54] MINIATURE JUMPER SWITCH

[75] Inventors: Giuseppe Bianca, Escondido; Robert M. Bogursky, Encintas, both of Calif.

[73] Assignee: Autosplice Systems, Inc., San Diego, Calif.

[21] Appl. No.: 606,368

[22] Filed: Feb. 23, 1996

[51] Int. Cl.$^6$ .................................................. H01H 15/06
[52] U.S. Cl. .......................... 200/542; 200/247; 200/537
[58] Field of Search .................................. 200/246, 245, 200/248, 250, 533, 535, 537, 538, 542, 551, 247

[56] References Cited

U.S. PATENT DOCUMENTS

| | | | |
|---|---|---|---|
| 1,866,563 | 7/1932 | Hammell | 200/542 |
| 2,239,426 | 4/1941 | Kimball | 200/542 |
| 3,377,450 | 4/1968 | Grady, Jr. et al. | 200/533 |
| 3,974,346 | 8/1976 | Keprda . | |
| 3,982,807 | 9/1976 | Anhalt et al. . | |
| 4,238,655 | 12/1980 | Vonder | 200/246 |
| 4,277,663 | 7/1981 | Soes | 200/551 |
| 4,926,012 | 5/1990 | de Beauvais et al. . | |
| 5,369,237 | 11/1994 | Mejerl et al. . | |
| 5,408,061 | 4/1995 | Martin | 200/537 |

*Primary Examiner*—David J. Walczak

[57] ABSTRACT

A low profile, push-pull, jumper switch that relies on movement of the switch housing to make and break the connection between two contact members mounted on the housing. The only metal used are the two contact members, which are cammed into contact by movement of the housing when placed in its closed-switch position. In a preferred embodiment, the two contact members are identical and are each constituted of a one-piece U-shaped metal member, with the U-bight depending from the housing and configured to be solderable to the PCB pads or through-holes and thus being fixed. Protrusions on the contacts latch the housing in its open-switch position or closed-switch position. The switch in one embodiment lends itself to SMT applications.

22 Claims, 4 Drawing Sheets

MINIATURE JUMPER SWITCH

The invention is directed to a miniature jumper switch for automatic placement on a printed circuit board (PCB) or the like.

BACKGROUND OF INVENTION

Jumpers or shunt connectors for configuring pinned electronic equipment are known in the art. See, for example, U.S. Pat No. 5,337,468. Typically, they comprise small plastic housings containing spring clips on their interior designed to mount over and electrically shod circuit two pins upstanding on a PCB and connected to other components on the PCB. With surface mount technology (SMT), the pins are replaced by flat electrically-conductive pads on the PCB, and thus a jumper for SMT would have to mount across adjacent pads and form an electrically-conductive connection between them.

Tape and reel supply of electrical pads for automatic pick-and-place by a mechanical or pneumatic device onto a PCB or similar device is well known in the art. See, for example, the description in copending U.S. application, Ser. No. 08/084,579, now U.S. Pat. No. 5,451,174. In the conventional system, a plastic carrier tape with sprocket holes along one or both edges is embossed to form a series of pockets into each of which is placed an electrical component. The assembly is then covered with a plastic strip and reeled up on a reel. During assembly of the PCB, the strip is unreeled, the plastic cover removed, and a pick-and-place head is used to contact and pick, for example, a SMT component out of a carrier pocket and place it in a desired position, usually under control of a computer, on one or more tinned PCB pads. The latter are usually provided with solder paste that acts to temporarily hold the SMT part onto the PCB pads during a subsequent solder reflow process which permanently bonds and electrically connects the part to the PCB circuitry via the pads. This system has been successfully used for many years.

It is desirable to place jumpers, and in particular, SMT jumpers, by pick-and-place equipment in the same manner as other SMT components to reduce assembly costs. Moreover, there is a need in the art for miniature jumpers that occupy a minimum of valuable space on a PCB. Still further, there is a need in the art for a miniature jumper that can be user-controlled to interconnect or disconnect adjacent pads on a PCB.

SUMMARY OF INVENTION

The principal object of the invention is a miniature switch that can controllably switch connections between adjacent pads on a PCB, that can be placed on a PCB by standard pick-and-place devices, and that is capable of low cost manufacture.

These and other objects are achieved in accordance with one feature of the invention with a low profile, push-pull, jumper switch that relies on movement of the switch housing to make and break the connection between two contact members mounted on the housing.

In accordance with a further feature of the invention, which contributes to its inexpensive manufacture, the only metal used are the two contact members, which are cammed into contact by movement of the housing when placed in its closed-switch position.

In a preferred embodiment of the invention for SMT or other applications, the two contact members are each constituted of a one-piece U-shaped metal member, with the U-bight depending from the housing and configured to be solderable to the PCB pads or PCB through-holes and thus being fixed. Means on the contacts latch the housing in its up open-switch position or down closed-switch position. Alternatively, the means can be used to latch the housing in its up closed-switch position or down openswitch position. These means can employ spring forces or housing or contact structure, or combinations.

In accordance with a further feature of the invention, when the housing is pushed down or pulled up and latched into its closed-switch position, the contact members at one end are cammed into a sliding contact due to displaced or asymmetrical cam surfaces on the housing or asymmetries in the contacts. The sliding action acts to provide a rubbing action which wipes the mating contact surfaces removing oxides or other contaminates, providing a more reliable switch.

In a further preferred embodiment, the contact members are configured such that the opposite contact ends protrude up from the housing when in its down position and serve as a visible flag of the switch condition.

In still a further preferred embodiment, a portion of the housing is configured with finger grip areas for easy user manipulation and is also provided with an exposed flat top surface for easy pick-up by a conventional vacuum pick-and-place device for placement onto a PCB in the normal manner.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

Figure 1:
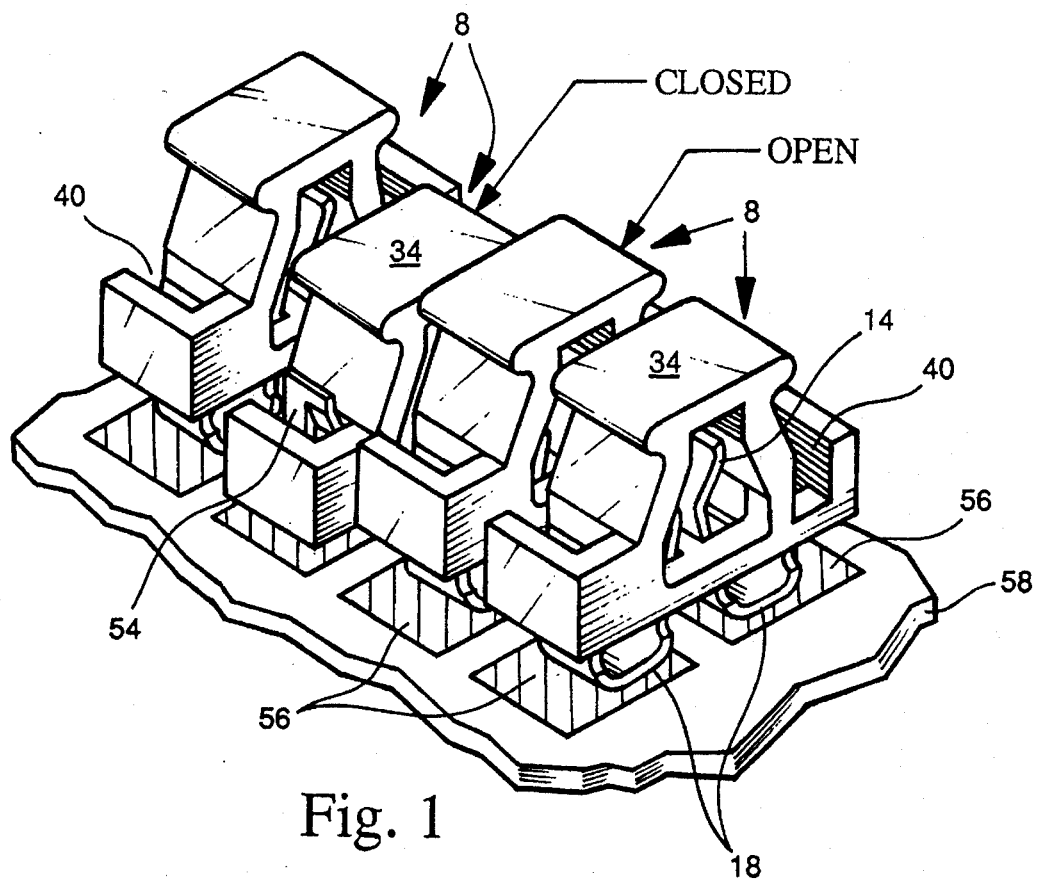
FIG. 1 shows in a schematic perspective view several jumper switches in accordance with one form of the invention soldered to pads on a part of a PCB.

One form of SMT jumperswitch 8 in accordance with the invention is illustrated in FIGS. 2–5. It comprises two spaced, one-piece, generally U-shaped contact members 10, 12 of spring metal, such as of electrically-conductive brass or other copper alloy. Each contact member comprises first 14 and second 16 arm portions on opposite sides of a bight portion 18. The bottom side 20 of the bight portion is relatively flat and configured for being soldered to a contact pad of a PCB. For this purpose, the bottom side 20 is tinned in the usual way. The two contact members extend vertically in the drawings, with the U facing upward.

Mounted on the two contact members is a one-piece electrically-insulating housing 22, preferably of plastic and made by molding. The housing 22 comprises a rectangular frame 24, open on both sides and with a center open region 26. On facing surfaces in the open region are provided cam surfaces 28, 30 that taper toward one another as the housing top is approached. The housing top is configured with finger grip areas 32 for finger gripping by a user, which finger grip areas are located just below a generally flat top surface 34 configured for receiving a suction head of standard pick-and-place equipment.

Figure 2:
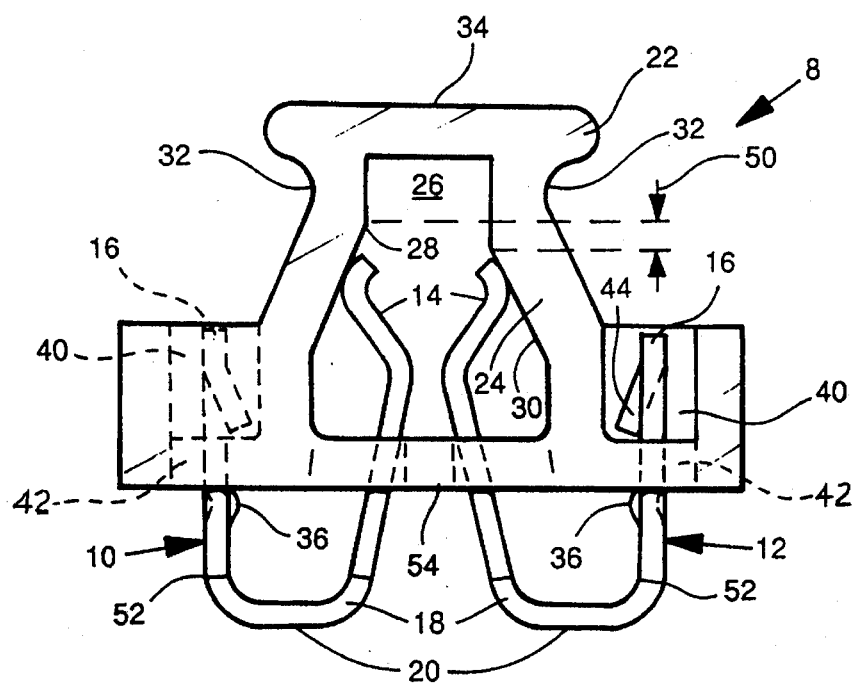
FIGS. 2 and 3 are front views of one of the jumper switches of FIG. 1 according to the invention in open and closed positions, respectively.

FIG. 2 shows the housing 22 in its up open-switch position, with the first contact arm portions 14 separated horizontally and with the housing resting by means of its cam surfaces 28, 30 on slightly bent ends of the arm portions 14. The spring forces exercised by the spring metal of the contact members 10, 12 maintain the arm portions 14 spaced laterally apart. The latter have a certain amount of stiffness which easily supports the light plastic housing 22. However, to provide additional protection against the housing moving downward accidentally, a protrusion in the form of a dimple 36 is formed in the second arm portions 16 above the flat surface 20. The housing has formed at its outer sides oppositely directed open sections 40 above a shelf at the housing bottom having apertures 42 through which pass the second arm portions 16. The configuration of the contact members 10, 12 the apertures 42, and the dimples 36 are such that the second arm portions 16 are pressed against the side walls of the apertures 42 producing an interfering relationship between the dimples 36 and the housing wall which, in the absence of a pushing force from above, will prevent the housing from moving downward. The housing in this stable open-switch position is positioned spaced from the bottom solderable surfaces 20. The upper end of the second arm portions 16 have bent-out tab portions 44 which, as is clear, interfere with the housing surfaces. These tab portions 44 serve as a housing lock and anti-over-travel device which prevents the housing 22 from being lost or accidentally lifted off and removed from the contact members 10, 12.

Figure 3:
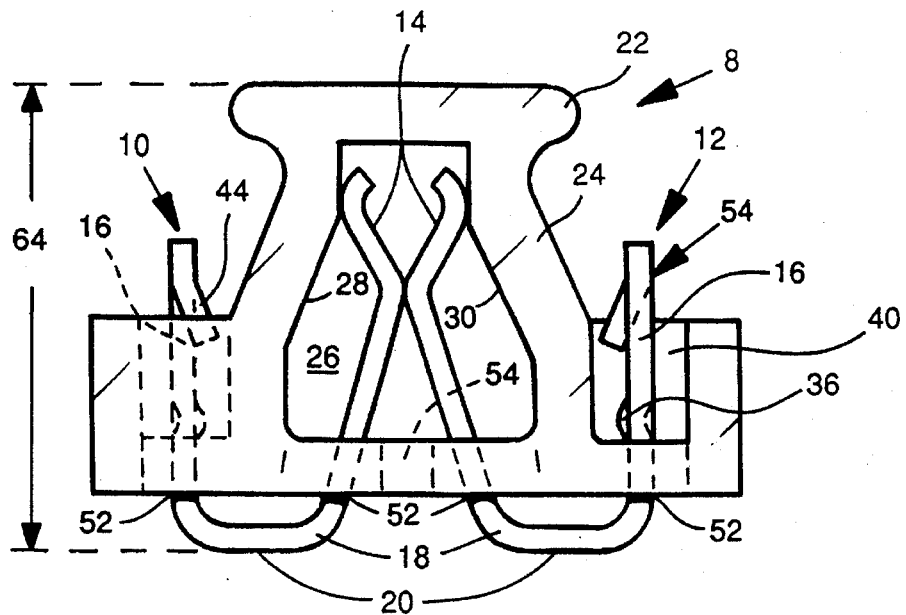

When the housing 22 is pushed down, either manually or automatically, with sufficient force that it rides over the dimple latches 36, it will position itself into a second stable closed-switch position illustrated in FIG. 3. Note that the dimple latches 36 are now inside the regions 40 and are held by the contact tension against the shelf of the housing wall preventing the housing from moving upward by itself.

As a result of the downward movement of the housing 22, the first arm portions 14 have been cammed into electrical contact with one another, and now the arm portions 14 are resting on non-tapered, generally parallel cam surfaces which avoids an excessive spring return force being applied to the housing to return it to its switch-open position. As will also be observed, the facing tapered cam surfaces 28, 30 are asymmetrical or vertically displaced with respect to one another. The vertical displacement is indicated by reference numeral 50. As a result, the contact between the facing parts of the first arm portions 14 is effected as a two-stage mating cycle in a sliding manner accompanied by a rubbing or wiping action which tends to remove oxide films or other contaminates. This wiping action is generated by differing the mating contour of the cam surfaces to displace the contacts at different rates. The first contact 14 at the right extends beyond a center line of the housing prior to engaging the second contact 14 at the left. When the left contact is cammed and arrives at the center, it must displace the right contact and push it back to the center, the final position shown in FIG. 3. This rubbing action wipes the contact mating area which assures the integrity of the electrical connection. The contacting area is preferably selectively plated with gold.

The housing 22 is also configured to limit the deflection of the spring contacts 14 and prevent them from being damaged by excessive stress. For example, in the closed-switch position, when the housing is in its down position, the bottom surfaces of the housing engage shoulders 52 close to or on the bight portions 20 of both contact members 10, 12. The shoulders 52 prevent further downward movement of the housing and assure that the first arm portions 14 never strike the housing interior at the top.

The housing 22 also has a contact separation member in the form of a separating wall 54 that lies between first arm portions 14 of the contact members and prevents accidental mating of the contacts when the housing is in its open-switch position. As mentioned, the housing remains in its open-switch position due to the spring loaded spring force of the contacts, and the dimples 36 secure that position.

The open sides of the housing facilitate cleaning of the switch contacts by flushing cleaning fluids through the openings to remove flux residues or other contaminates.

Figure 4:
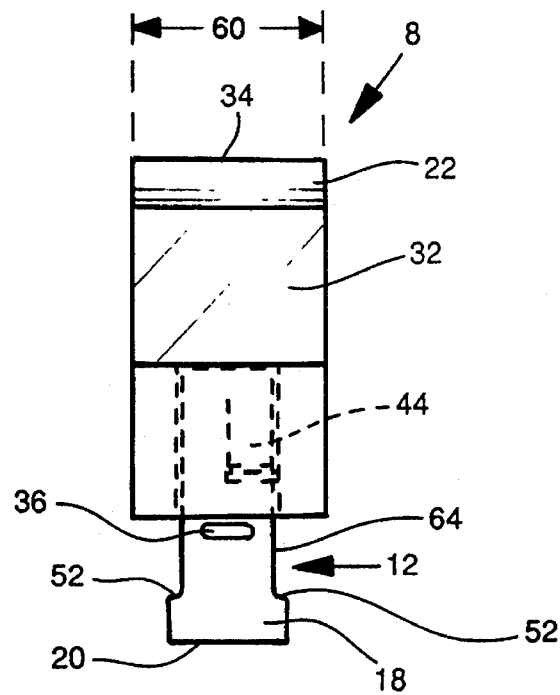
FIGS. 4 and 5 are end and top views, respectively, not to the same scale, of the switch illustrated in FIG. 2.
Figure 5:
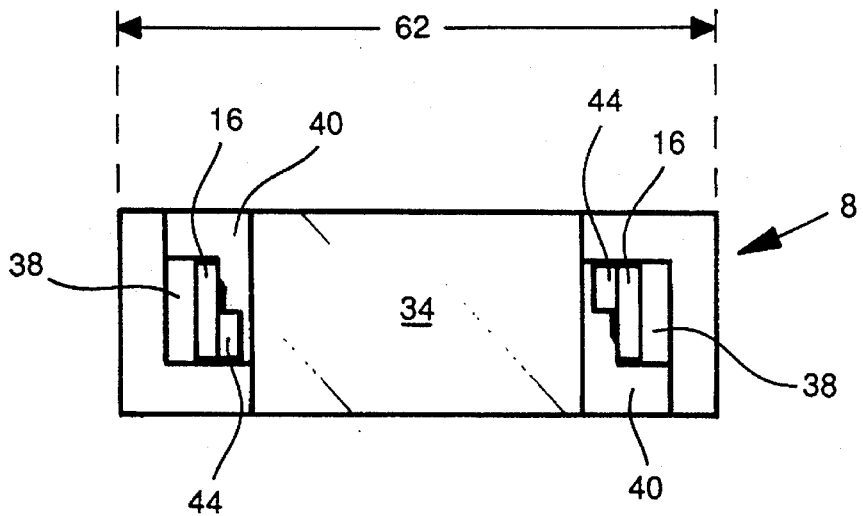

As illustrated in FIG. 4, the bight portion 20 is larger in width than the contact sections above it, referenced 64. The reduced size of the latter is used to take up any stresses imposed on the switch and thus prevents those stresses from being concentrated at and possibly breaking the soldered joint at the bight portions 20.

The length of the second arm portions 16 is chosen such that, when the housing is its open-switch position (FIG. 2), the arm ends are reasonably hidden below the top of the open sections 40, but when the housing is pushed down to its closed-switch position (FIG. 3), the arm ends are exposed 54 and protrude above the level of the open sections 40 and can serve as a visual "closed" flag providing visual evidence of the switch's closed condition. If desired, colors can be added to the housing to identify different PCB locations.

Figure 6:
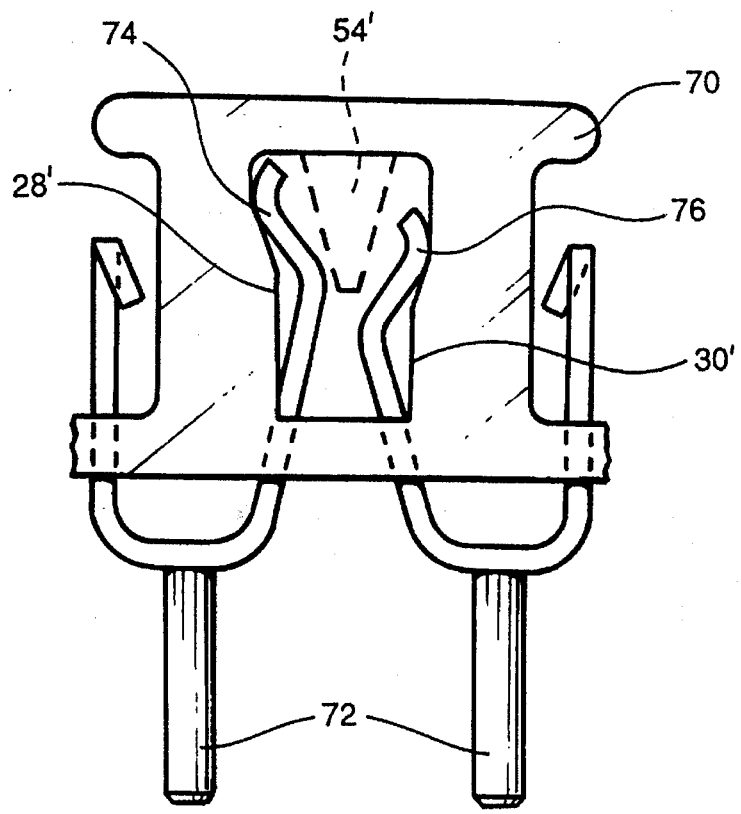
FIGS. 6 and 7 are front views of another form of jumper switch according to the invention in open and closed positions, respectively.
Figure 7:
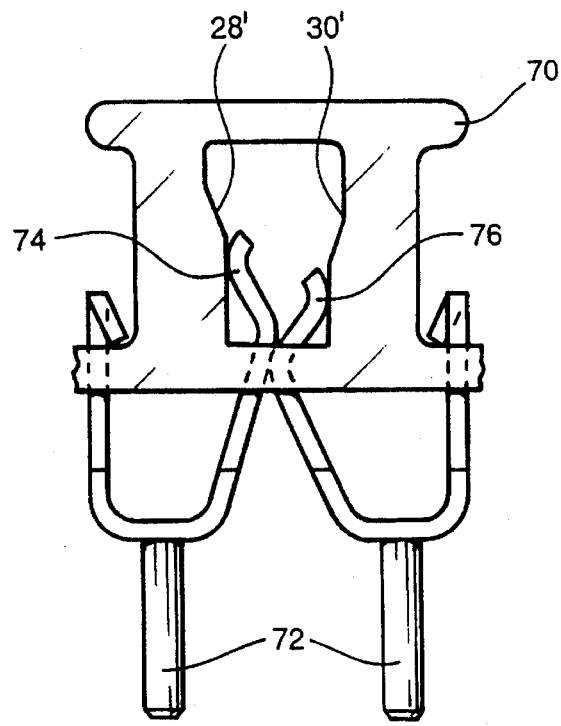

In the preferred embodiment so far described, the up position of the housing places the switch in its open-switch condition, and the down position of the housing places the switch in its closed-switch condition. This can be reversed. FIGS. 6 and 7 show a variant in which the up position of the housing (FIG. 7) places the switch in its closed-switch condition, and the down position of the housing (FIG. 6) places the switch in its open-switch condition. This is achieved by reversing the taper of the housing cam sections 28', 30'. The lower cam section are parallel and forces the contacts together when the housing 70 is pulled up, whereas the upper cam sections are tapered outwardly so that the natural spring tension separates the contacts when the housing is pushed down. As with the first embodiment, structure 54', shown in phantom in FIG. 6, can be provided to ensure the contacts remain spaced laterally when the housing is placed in its down position.

It will also be understood that, while the preferred SMT embodiment has flat contact surfaces 20 for soldering to PCB pads, the bight portions 20 can also be provided with depending pins or posts 72 (FIGS. 6, 7) and thus the switch can be soldered via those pins 72 into the typical plated through-holes of a PCB for selectively making and breaking connections between adjacent through-holes. A switch with posts 72 that extend below the curved portion of the contact can be utilized in several different ways, such as: 1) to solder the posts in a through hole application where solder in the hole is the primary retention means (usually the solder joint would be below the PCB, soldered in a wave method); 2) to solder the SMT pads of the contact, while utilizing the posts as an alignment device, where the SMT pad solder joint is the primary retention means (the joint is on top of the PCB, created by solder paste, soldered by the IR method); or 3) use of the post 72 to act solely as a mechanical stiffening device.

FIGS. 6 and 7 also illustrate that the desired contact rubbing action can also be achieved with symmetrical cam surfaces 28', 30' but with asymmetrical contacts 74, 76. In this embodiment, the different lengths of the contact ends 74, 76 ensures that the shorter contact end 76 is cammed inwardly before the longer end 74, so that when the longer end 74 is cammed inwardly it pushes the shorter end back to the center producing the desired rubbing action.

Figure 8:
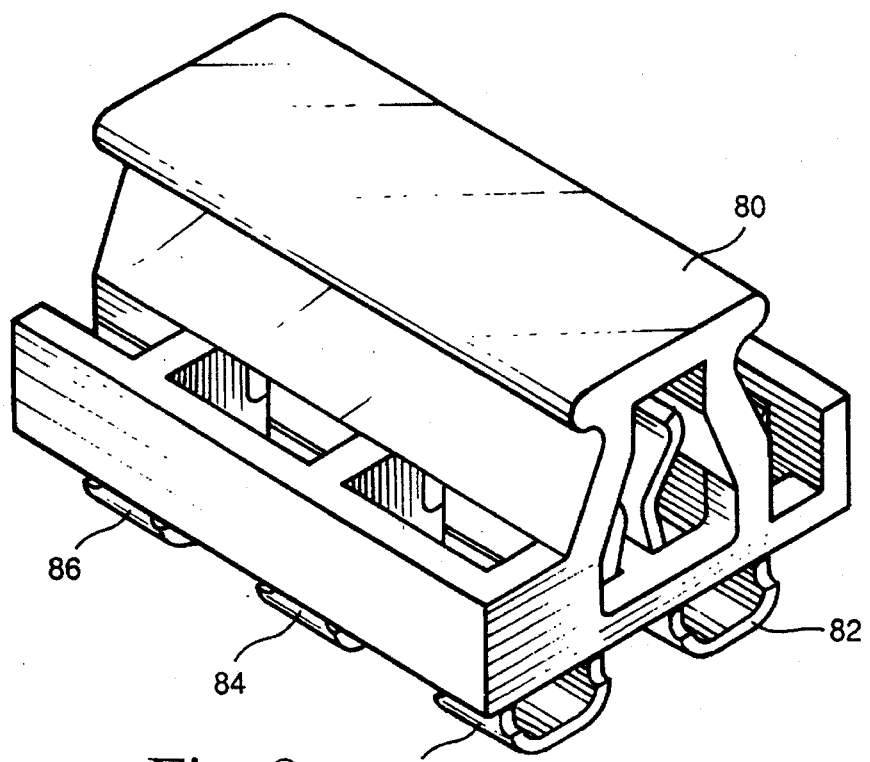
FIG. 8 is a perspective view of a ganged form of jumper switch according to the invention in its open position.

FIG. 1 illustrates four independent SMT switches 8 soldered into position on pads 56 of a PCB 58. Counting from the right side, the 1st, 2nd and 4th switches are in their open positions, and the 3rd switch is in its closed position. Alternatively, as shown in FIG. 8, plural switches can be ganged together by integrating their housings into a single housing 80 with multiple sets of contact members 82, 84, 86, with the result that movement of the common housing 80 causes simultaneous placement of all the switch pairs into their open-switch or closed-switch conditions.

The switch configuration lends itself to low cost manufacture (only 3 parts are needed) and can be given a low profile and be made with small pitch external contacts as well as small volume, as the depth (the horizontal dimension 60 in FIG. 4) need be not much larger than that of the contact members 10, 12. As an example only, the depth 60 can be about 1.6 mm, the length 62 about 4.8 mm, and the height 64 about 3.4 mm, for pad spacings on 2.5 mm centers. The displacement 50 can be about 0.4 mm.

The switches of the invention can be packaged in the pockets of the conventional carrier strip or in other equivalent ways and supplied in reel form to PCB assemblers. The molding plastic for the housing should be able to withstand the elevated temperatures of the standard reflow-soldering process that the PCB will be subject to. Molding plastics with this property are well known in the art and are available commercially from suppliers such as General Electric and DuPont. Other plastics will be obvious to those skilled in this art.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A jumper switch comprising:
    a) a pair of contact members each having a first contact portion and a second solderable portion,
    b) a switch housing mounted on the contact members and movable on the contact members from a first switch position to a second switch position to break and make, respectively, an electrical connection between the first contact portions of the two contact members,
    c) said second solderable portions extending out from the housing and configured for being soldered to conductive areas of external pads or through-holes,
    d) first means for maintaining separated the first contact portions of the contact members when the housing is in its first position,
    e) second means for camming into contact the first contact portions of the two contact members when the housing is in its second position.

2. A jumper switch as claimed in claim 1, wherein the first position of the housing with respect to the contact members is above the second position of the housing.

3. A jumper switch as claimed in claim 1, wherein the first position of the housing with respect to the contact members is below the second position of the housing.

4. A jumper switch as claimed in claim 1, wherein the first means comprises spring forces.

5. A jumper switch as claimed in claim 1, wherein the first means comprises an interfering engagement of the housing with one of the contact members.

6. A jumper switch as claimed in claim 1, wherein the two contact members are constituted of metal and constitute the only metal in the switch.

7. A jumper switch comprising:
    a) a pair of contact members each having a first contact portion and a second solderable portion,
    b) a switch housing mounted in the contact members and movable on the contact members from a first switch position to a second switch position to break and make, respectively, an electrical connection between the first contact portions of the two contact members,
    c) said second solderable portions extending out from the housing and configured for being soldered to conductive areas of external pads or through-holes,
    d) first means for maintaining separated the first contact portions of the contact members when the housing is in its first position,
    e) second means for camming into contact the first contact portions of the two contact members when the housing is in its second position,
    f) wherein each contact member is constituted of a one-piece U-shaped metal member having first and second arm portions on opposite sides of a bight portion, the bight portion constituting the second solderable portion, the first arm portion constituting the first contact portion.

8. A jumper switch as claimed in claim 7 for surface mounting, wherein the bight portion comprises a generally flat portion.

9. A jumper switch as claimed in claim 7, wherein the bight portion comprises a generally pin-shaped portion.

10. A jumper switch as claimed in claim 7, further comprising means on the second arm portions for latching the housing in its first and second positions.

11. A jumper switch as claimed in claim 10, wherein the means for latching comprises a protrusion positioned to interferingly engage portions of the housing in both its first and second positions.

12. A jumper switch as claimed in claim 7, wherein the second means for camming produce a sliding rubbing contact between the first contact portions.

13. A jumper switch as claimed in claim 12, wherein the means for camming comprises facing camming surfaces on the housing.

14. A jumper switch as claimed in claim 13, wherein the facing camming surfaces are relatively displaced to produce the sliding rubbing contact.

15. A jumper switch as claimed in claim 13, wherein the first contact portions of the contact members are of different lengths to produce the sliding rubbing contact.

16. A jumper switch as claimed in claim 7 for surface mounting, wherein the second arm portions occupy a first position when the housing is in its first position and a second position when the housing is in its second position, said second arm portions being visible from a point outside of the housing when in its second position.

17. A jumper switch as claimed in claim 16, wherein the housing is configured such that the second arm portions protrude up from the housing when in its second position and serve as a visible flag of one of a closed-switch and open-switch condition.

18. A jumper switch as claimed in claim 7, further comprising stops on the contact members close to their bight portion for preventing the housing from moving substantially beyond its second position.

19. A jumper switch as claimed in claim 1; wherein a portion of the housing is configured with finger grip areas for easy user manipulation.

20. A jumper switch as claimed in claim 19, wherein a portion of the housing is configured with an exposed flat top surface.

21. A jumper switch as claimed in claim 1, wherein the housing comprising open sides.

22. A jumper switch as claimed in claim 1 for surface mounting, wherein each of the contact members have a reduced-size section adjacent the second solderable portion.

* * * * *